United States Patent

Reinprecht

(10) Patent No.: US 8,796,732 B2
(45) Date of Patent: Aug. 5, 2014

(54) THYRISTOR COMPONENT

(75) Inventor: Wolfgang Reinprecht, Tobelbad (AT)

(73) Assignee: ams AG, Unterpremstätten (AT)

( * ) Notice: Subject to any disclaimer, the term of this patent is extended or adjusted under 35 U.S.C. 154(b) by 0 days.

(21) Appl. No.: 13/885,672

(22) PCT Filed: Nov. 16, 2011

(86) PCT No.: PCT/EP2011/070258
§ 371 (c)(1),
(2), (4) Date: Aug. 1, 2013

(87) PCT Pub. No.: WO2012/066037
PCT Pub. Date: May 24, 2012

(65) Prior Publication Data
US 2013/0307020 A1 Nov. 21, 2013

(30) Foreign Application Priority Data

Nov. 19, 2010 (DE) .......................... 10 2010 051 961

(51) Int. Cl.
*H01L 29/74* (2006.01)
*H01L 29/40* (2006.01)
*H01L 27/02* (2006.01)
*H01L 29/06* (2006.01)

(52) U.S. Cl.
CPC .............. *H01L 29/74* (2013.01); *H01L 29/402* (2013.01); *H01L 27/0262* (2013.01); *H01L 29/0692* (2013.01); *H01L 29/7436* (2013.01)
USPC ....................................................... 257/173

(58) Field of Classification Search
CPC ............ H01L 27/0817; H01L 29/7436; H01L 29/66393
USPC .......................................................... 257/173
See application file for complete search history.

(56) References Cited

U.S. PATENT DOCUMENTS

| | | | |
|---|---|---|---|
| 6,479,871 B2 | 11/2002 | Peters et al. | |
| 6,498,357 B2 | 12/2002 | Ker et al. | |
| 7,042,028 B1 | 5/2006 | Huang et al. | |

FOREIGN PATENT DOCUMENTS

| | | |
|---|---|---|
| CN | 101257005 A | 9/2008 |
| WO | 00/14803 A1 | 3/2000 |

OTHER PUBLICATIONS

Weste et al., "Principles of CMOS VLSI Design" Addison-Wesley, USA, Dec. 31, 1985, pp. 58-60 and 86-89.

*Primary Examiner* — Tran Tran
(74) *Attorney, Agent, or Firm* — McDermott Will & Emery LLP

(57) ABSTRACT

The invention relates to a thyristor component, wherein a p-conductive trough (30) adjoins an n-conductive trough (20) at two opposite sides. Highly n-conductive areas (21, 23) and highly p-conductive areas (22) are disposed in the n-trough in alternating sequence, such that outer n-areas (23) are spaced apart at a smaller distance from the p-trough than the p-areas. Further n-areas (35) and further p-areas (36) are disposed in the p-trough on both sides of the n-trough, wherein the further n-area is disposed in each case at a smaller distance from the n-trough than the further p-area. Connection contacts (41, 42) are present on the n-areas and on the p-areas of the n-trough, except for the outermost n-areas nearest to the p-trough. The connection contacts are electrically conductively connected to each other. Further connection contacts (45, 46) are present on the further n-areas and on the further p-areas, wherein the further connection contacts are electrically connected to each other.

4 Claims, 2 Drawing Sheets

THYRISTOR COMPONENT

The present invention relates to a thyristor component, in particular in the manner of an SCR (silicon controlled rectifier) for use as ESD protection.

Thyristor components in the manner of an SCR are highly effective as protection against ESD (electrostatic discharge) since the low clamping voltage enables high discharge currents in conjunction with limited power dissipation on silicon. One disadvantage that occurs, however, is the current localization, which has the effect that the operating properties of the component are not stable enough. Triggering that is as uniform as possible in a location-independent manner and a uniform current distribution are required for high-efficiency ESD protective elements.

CN 101257005 describes an SCR as ESD protection component. Said component comprises a sequence of highly n-conducting and highly p-conducting regions situated in an n-doped region and in a p-doped region at the top side of a semiconductor component. A highly n-conducting region is situated at the boundary between the n-doped region and the p-doped region.

It is an object of the present invention to specify a component suitable for ESD protection having a current distribution that is as uniform as possible in the triggered state.

This object is achieved by means of the thyristor component comprising the features of claim 1. Embodiments derive from the dependent claims.

In the case of the thyristor component, an n-conducting well is situated at a top side of a p-conducting semiconductor substrate. A p-conducting well adjoins the n-conducting well at least at two mutually opposite sides. Highly n-conducting regions and highly p-conducting regions are arranged in the n-conducting well between the mutually opposite sides in an alternating sequence, wherein the respective outer regions in said sequence are highly n-conducting. In the p-conducting well, a further highly n-conducting region and a further highly p-conducting region are respectively arranged on both sides of the n-conducting well, wherein the highly n-conducting region is in each case arranged at a smaller distance from the n-conducting well than the highly p-conducting region.

Connection contacts are situated on the highly n-conducting regions and on the highly p-conducting regions of the n-conducting well with the exception of the highly n-conducting outer regions closest to the p-conducting well. Said highly n-conducting outer regions that are not contact-connected in each case form an electrical resistance which increases from the lateral ends of the outer regions continuously as far as the center thereof. Consequently, the resistance is greatest in the center, which improves the triggering behavior of the component. The connection contacts are electrically conductively connected to one another. Further connection contacts are situated on the further highly n-conducting regions and on the further highly p-conducting regions of the p-conducting well, wherein the further connection contacts are likewise electrically conductively connected to one another.

In embodiments of the thyristor component, three highly n-conducting regions and two highly p-conducting regions are arranged in the n-conducting well.

In further embodiments of the thyristor component, the highly n-conducting outer regions of the n-conducting well are arranged at a distance from the p-conducting well.

In further embodiments of the thyristor component, electrically conductive field plates are arranged above regions of the p-conducting well, said regions adjoining the n-conducting well, and the field plates are electrically insulated from the n-conducting well and from the p-conducting well. The field plates foster the switching-on or triggering of the component in the regions covered by the field plates. The interaction between the field plates and the electrical resistance of the highly n-conducting outer regions of the n-conducting well that are not contact-connected has the effect that the component triggers in the center of the relevant region.

In further embodiments of the thyristor component, the field plates are electrically conductively connected to the connection contacts on the highly n-conducting regions and on the highly p-conducting regions of the n-conducting well.

In further embodiments of the thyristor component, the highly n-conducting outer regions of the n-conducting well are arranged at a distance from the p-conducting well, and the field plates are also arranged above regions of the n-conducting well, said regions in each case being situated between a highly n-conducting outer region of the n-conducting well and the p-conducting well.

In further embodiments of the thyristor component, the n-conducting well, the p-conducting well, the highly n-conducting regions, the further highly n-conducting regions, the highly p-conducting regions and the further highly p-conducting regions are arranged mirror-symmetrically.

In further embodiments of the thyristor component, the highly n-conducting regions and the highly p-conducting regions are embodied in strip-shaped fashion and are oriented parallel to one another. In particular, in this case, a highly n-conducting inner region can be connected to the highly n-conducting outer regions at mutually opposite ends, and the outer regions can have electrical resistances which respectively increase from the ends of the outer regions toward the center.

In further embodiments, the thyristor component can be connected as ESD protection. The connection contacts can be connected as connection of an operating voltage and the further connection contacts can be connected as ground connection.

Examples of the thyristor component will be described in greater detail with reference to the accompanying figures.

Figure 1:
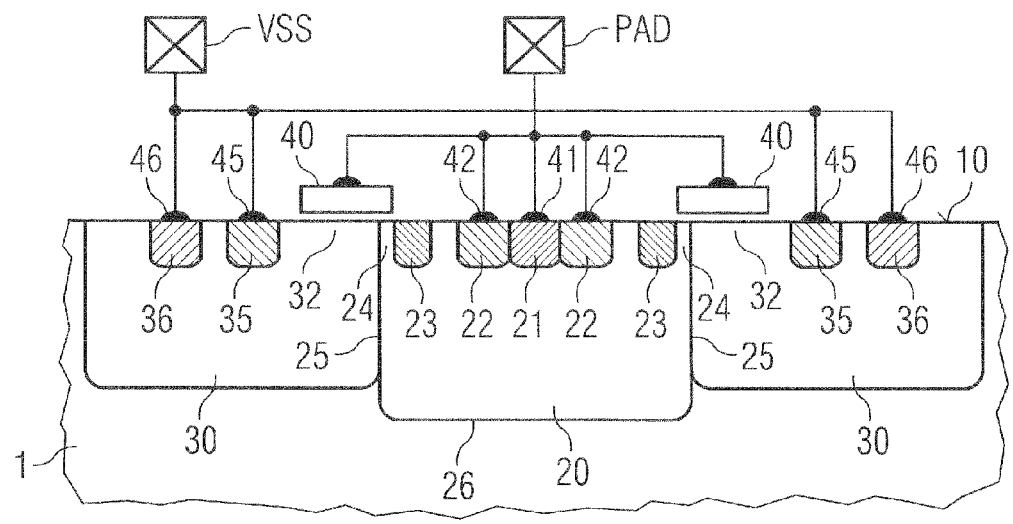
FIG. 1 shows a cross section through an embodiment of the thyristor component.

FIG. 1 shows in cross section a semiconductor substrate 1, at the top side 10 of which an n-conducting well 20 is arranged between portions of a p-conducting well 30. A pn junction is situated between the wells 20, 30. The semiconductor substrate 1 can be doped in a p-conducting fashion, in particular. In the n-conducting well 20, highly n-conducting regions 21, 23 and highly p-conducting regions 22 are arranged alternately at the top side 10. Those regions 23 which are in each case closest to the p-conducting well 30 are designated hereinafter as outer regions 23. Said outer regions 23 are n-conducting and, in the embodiment illustrated, spaced apart from the p-conducting well 30 by a boundary region 24 of the n-conducting well 20. The outer regions 23 can extend in particular in strip-shaped fashion in the direction perpendicular to the plane of the drawing in FIG. 1 and are preferably connected to the inner highly n-conducting region 21 at their ends present in front of and behind the plane of the drawing in FIG. 1.

The remaining highly n-conducting regions 21 and highly p-conducting regions 22 are provided with connection contacts 41, 42 on the top side 10. Said connection contacts 41, 42 are electrically conductively connected to one another. In the embodiment illustrated, they are additionally electrically conductively connected to field plates 40, which are electrically insulated from the semiconductor material and, in this embodiment, are arranged above the boundary 25 between the n-conducting well 20 and the p-conducting well 30 and above the boundary regions 32 of the p-conducting well 30 that adjoin the n-conducting well 20. The field plates 40 can be metal or electrically conductively doped polysilicon.

In the p-conducting well 30, a further highly n-conducting region 35 and a further highly p-conducting region 36 are respectively situated on both sides of the n-conducting well 20 at the top side 10. The further highly n-conducting regions 35 are situated at a smaller distance from the n-conducting well 20 than the further highly p-conducting regions 36. The further highly n-conducting regions 35 and the further highly p-conducting regions 36 of the p-conducting well 30 are provided with further connection contacts 45, 46 on the top side 10 of the semiconductor substrate 1. The further connection contacts 45, 46 are electrically conductively connected to one another.

The connection contacts 41, 42 can be provided for a connection PAD of an operating voltage, and the further connection contacts 45, 46 can be provided for a ground connection VSS. The n-conducting well 20 forms an electrical n-type resistance, and the p-conducting well 30 forms an electrical p-type resistance. If the semiconductor substrate 1 is doped in a p-conducting fashion, a further pn junction is situated at the boundary 26 between the n-conducting well 20 and the p-conducting material of the semiconductor substrate 1.

Figure 2:
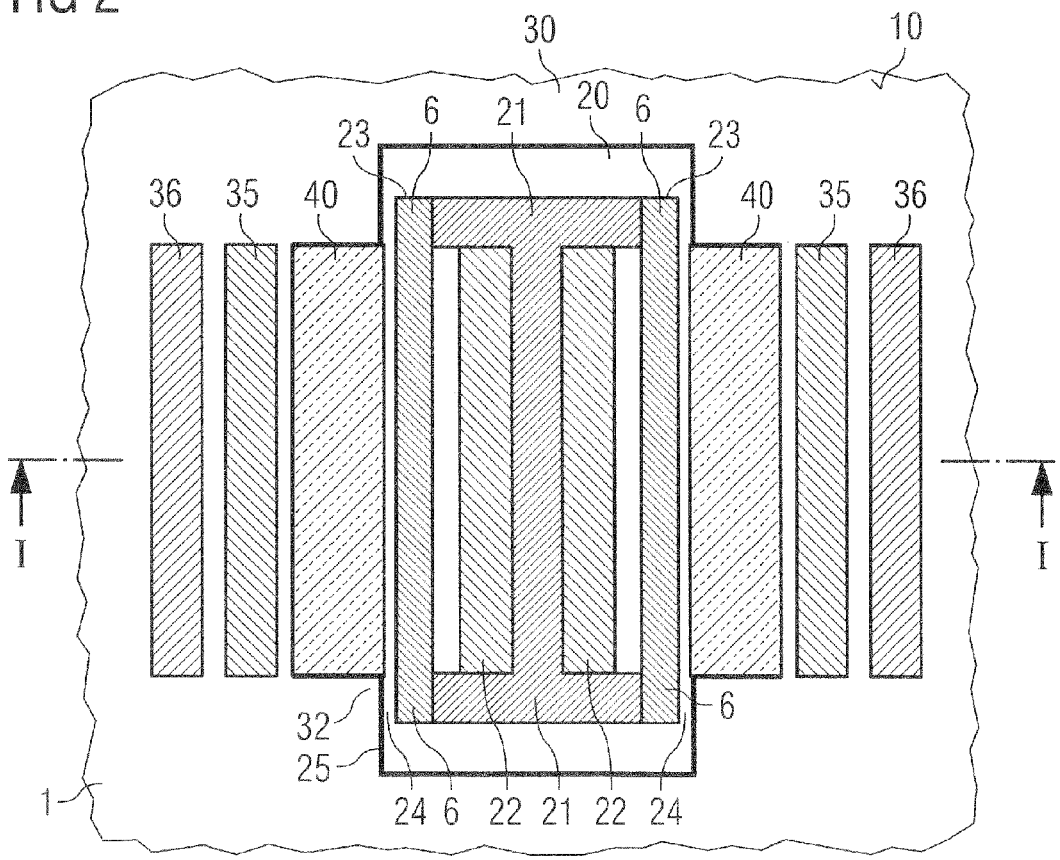
FIG. 2 shows an embodiment of the thyristor component in a plan view.

FIG. 2 shows an embodiment of the component in a plan view. In FIG. 2, the same reference signs as in FIG. 1 are used and the position of the cross section from FIG. 1 is marked. It can be discerned in FIG. 2 that this embodiment of the component is mirror-symmetrical with respect to the central highly n-conducting region 21. The highly n-conducting regions 21, 23, the further highly n-conducting regions 35, the highly p-conducting regions 22 and the further highly p-conducting regions 36 are embodied in strip-shaped fashion and are oriented parallel to one another in this embodiment. The outer regions 23 in this embodiment are connected at their lateral ends to the inner highly n-conducting region 21, which is in each case widened in a T-shaped fashion. In the vicinity of the transition locations between the inner region 21 and the outer regions 23, an electrical resistance occurs in the outer regions 23, said resistance being designated hereinafter as resistance Rd.

The connection contacts 41, 42 need not necessarily be applied separately on the highly n-conducting and highly p-conducting regions 21, 22 of the n-conducting well 20, but rather can, if appropriate, also be embodied as an individual continuous connection contact. The same correspondingly applies to those further connection contacts 45, 46 which are in each case arranged on the same side with respect to the n-conducting well 20.

In the embodiment illustrated in FIG. 2, the field plates 40, in a manner corresponding to the illustration in FIG. 1, cover portions of the boundary regions 24, 32 between the highly n-conducting outer regions 23 of the n-conducting well 20 and the further highly n-conducting regions 35 of the p-conducting well 30. In this example, therefore, the boundary 25 between the wells 20, 30 is at least partly covered by the field plates 40.

Figure 3:
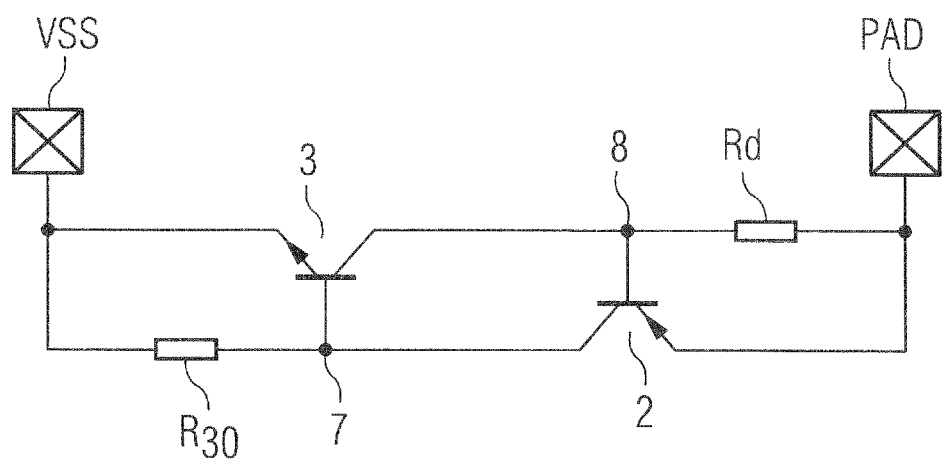
FIG. 3 shows a circuit diagram representing essential electrical functions of the thyristor component.
Figure 4:
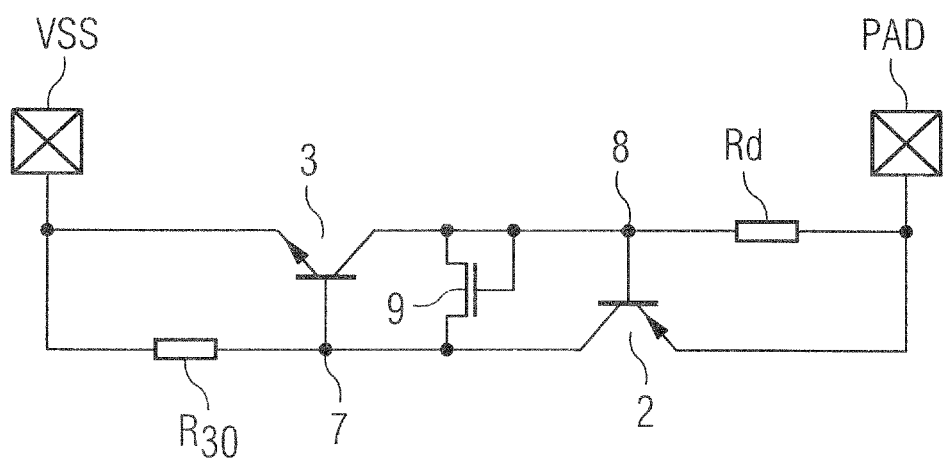
FIG. 4 shows a circuit diagram in accordance with FIG. 3 with the representation of an additional field effect transistor function.

FIGS. 3 and 4 show versions of a circuit diagram which schematically reproduces circuit functions of the thyristor component from FIG. 1. A thyristor is an interconnection of a pnp transistor 2 and an npn transistor 3. These transistors 2, 3 have in common the base-collector junction of the pnp transistor 2 and the collector-base junction of the npn transistor 3, corresponding to the pn junction between the p-type circuit node 7 and the n-type circuit node 8 of the circuit diagram in FIGS. 3 and 4 or corresponding to the pn junction at the boundary 25 between the p-conducting well 30 and the n-conducting well 20 with the highly n-conducting outer regions 23 in the component in accordance with FIG. 1. In those embodiments in which the field plates 40 are provided, the circuit function of a field effect transistor 9 corresponding to FIG. 4 is present between the p-type circuit node 7 and the n-type circuit node 8. The gate of the field effect transistor is formed by the field plates 40.

The n-type resistance Rd formed by the highly n-conducting outer region 23 that is not contact-connected becomes apparent between the connection PAD of the operating voltage and the boundary regions 24 of the n-conducting well 20. The boundary regions 24 adjoin the p-conducting well 30 and correspond to the circuit node 8. The p-type resistance R30 formed by the p-conducting well 30 becomes apparent between the further connections 46, which are situated on the further highly p-conducting regions 36 of the p-conducting well 30 and are connected to the connection VSS, and the boundary regions 32 of the p-conducting well 30. The boundary regions 32 adjoin the n-conducting well 20 and correspond to the p-type circuit node 7.

It can be advantageous if the regions between the further highly n-conducting regions 35 of the p-conducting well 30 and the highly n-conducting outer regions 23 of the n-conducting well 20 that are not contact-connected is completely covered by the field plates 40, but this does not have to be the case in embodiments. The field plates 40 are preferably situated above the boundary 25 between the n-conducting well 20 and the p-conducting well 30 and above the adjacent boundary regions 32 of the p-conducting well 30.

In the component described, a uniform current distribution is brought about by the resistance Rd of the contactless highly n-conducting outer region 23 within the n-conducting well 20 between the boundary 25 with respect to the p-conducting well 30 and the anode formed by the highly p-conducting regions 22. Since the connection contacts are absent on the highly n-conducting outer regions 23, a suitable electrical resistance Rd is present which controls the current from the highly p-conducting regions 22—or the emitter-base junction of the pnp transistor 2—to the further highly n-conducting regions 35 of the p-conducting well 30—or the VSS connections, respectively. On account of the highly n-conducting outer regions 23 of the n-conducting well 20 that are not contact-connected, a breakdown voltage—required for triggering the component—arises which is high enough to use the component as ESD protection.

The T-shaped formation of the contact-connected n-conducting region 21 is prevented from breakdown by a larger distance from the edge of the n-conducting well 20. At the four corner points 6 (FIG. 2), the contact-connected highly n-conducting regions 21 undergo transition to the highly n-conducting outer regions 23 and, owing to the advantageous low resistance, uniform breakdown occurs at all four corner points 6. Since a stronger current is required there in comparison with the contactless region of the component, in order to retain the snapback state, after the triggering process the main current flow is shifted away from the corner points 6 more into the center. This measure prevents current localization.

The advantages of the thyristor component are, in particular, the trigger voltage which is scalable by means of the boundary regions 24, the uniform current distribution which is brought about by means of the contactless outer n+ regions 23, and a gate which is formed by the field plates 40 above the base of the npn transistor 3 and which, in conjunction with the contactless n+ regions 23, maintains a simultaneous current-carrying of both sides of the component. The operating properties of the component for use as ESD protection are likewise improved by the symmetrical construction.

LIST OF REFERENCE SIGNS

1 Semiconductor substrate
2 pnp transistor
3 npn transistor
6 Corner point of the component
7 p-type circuit node
8 n-type circuit node
9 Field effect transistor
10 Top side of the semiconductor substrate
20 n-conducting well
21 Highly n-conducting region of the n-conducting well
22 Highly p-conducting region of the n-conducting well
23 Outer highly n-conducting region of the n-conducting well
24 Boundary region of the n-conducting well
25 Boundary between n- and p-conducting wells
26 Boundary between n-conducting well and semiconductor substrate
30 p-conducting well
32 Boundary region of the p-conducting well
35 Further highly n-conducting region
36 Further highly p-conducting region
40 Field plate
41 Connection contact
42 Connection contact
45 Further connection contact
46 Further connection contact
PAD Ground connection
Rd Resistance of the outer regions 23
R30 Resistance of the p-conducting well 30
VSS Connection of an operating voltage

I claim:

1. A thyristor component comprising:
a p-conducting semiconductor substrate;
an n-conducting well at a top side of the semiconductor substrate;
a p-conducting well, which adjoins the n-conducting well at least at two mutually opposite sides;
highly n-conducting regions and highly p-conducting regions, which are embodied in strip-shaped fashion and are arranged parallel to one another in the n-conducting well in an alternating sequence, wherein the respective outer regions in said sequence are highly n-conducting, a highly n-conducting inner region is connected to the highly n-conducting outer regions at mutually opposite ends, and the outer regions have electrical resistances which respectively increase from the ends of the outer regions toward the center;
further highly n-conducting regions and further highly p-conducting regions, which are embodied in strip-shaped fashion and are arranged parallel to one another in the p-conducing well, wherein the further highly n-conducting regions are arranged at a smaller distance from the n-conducting well than the further highly p-conducting regions;
connection contacts on the highly n-conducting regions and on the highly p-conducting regions of the n-conducting well with the exception of the highly n-conducting outer regions, wherein the connection contacts are electrically conductively connected to one another; and
further connection contacts on the further highly n-conducting regions and on the further highly p-conducting regions of the p-conducting well, wherein the further connecting contacts are electrically conductively connected to one another.

2. The thyristor component according to claim 1, wherein electrically conducting field plates are arranged above regions of the p-conducting well,
wherein said regions adjoin the n-conducting well, and
wherein the field plates are electrically insulated from the n-conducting well and from the p-conducting well.

3. The thyristor component according to claim 2, wherein the field plates are electrically conductively connected to the connection contacts on the highly n-conducting regions and on the highly p-conducting regions of the n-conducting well.

4. The thyristor component according to claim 2 or 3, wherein the highly n-conducting outer regions of the n-conducting well are arranged at a distance from the p-conducting well, and
wherein the field plates are also arranged above regions of the n-conducting well, said regions being situated between the highly n-conducting outer regions of the n-conducting well and the p-conducting well.

\* \* \* \* \*